(12) United States Patent
Choi et al.

(10) Patent No.: US 10,229,752 B2
(45) Date of Patent: Mar. 12, 2019

(54) MEMORY DEVICE CORRECTING DATA ERROR OF WEAK CELL

(71) Applicant: SK hynix Inc., Gyeonggi-do (KR)

(72) Inventors: Hae-Rang Choi, Gyeonggi-do (KR); Sung-Soo Chi, Gyeonggi-do (KR); Dong-Jae Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 15/682,685

(22) Filed: Aug. 22, 2017

(65) Prior Publication Data

US 2018/0151250 A1    May 31, 2018

(30) Foreign Application Priority Data

Nov. 28, 2016   (KR) .......................... 10-2016-0159171

(51) Int. Cl.
| | |
|---|---|
| *G11C 7/00* | (2006.01) |
| *G11C 29/00* | (2006.01) |
| *G11C 29/42* | (2006.01) |
| *G11C 29/50* | (2006.01) |

(52) U.S. Cl.
CPC ............ *G11C 29/783* (2013.01); *G11C 29/42* (2013.01); *G11C 29/50016* (2013.01)

(58) Field of Classification Search
CPC .............................. G11C 29/783; G11C 29/42

USPC ........................................................ 365/222
See application file for complete search history.

(56) References Cited

U.S. PATENT DOCUMENTS

| | | | | |
|---|---|---|---|---|
| 2009/0161459 A1* | 6/2009 | Kohler | .................. | G11C 11/406 365/201 |
| 2013/0279284 A1* | 10/2013 | Jeong | .................... | G11C 11/402 365/222 |
| 2014/0269123 A1* | 9/2014 | Kim | .................. | G11C 11/40618 365/200 |
| 2016/0315639 A1* | 10/2016 | Shang | ........................ | G06F 9/38 |

FOREIGN PATENT DOCUMENTS

| | | |
|---|---|---|
| KR | 1020140005757 | 1/2014 |
| KR | 1020140125981 | 10/2014 |

* cited by examiner

*Primary Examiner* — Tha-O H Bui
(74) *Attorney, Agent, or Firm* — IP & T Group LLP

(57) ABSTRACT

A memory device may include: a plurality of memory cells; a weak cell information storage unit suitable for storing a weak address and parity information corresponding to one or more weak cells having a shorter data retention time than a reference time, among the plurality of memory cells; an ECC (Error Correction Code) circuit suitable for detecting and correcting an error bit of the one or more weak cells using the parity information; and a refresh control unit suitable for controlling the plurality of memory cells to be refreshed at a cycle equal to or more than the reference time.

17 Claims, 13 Drawing Sheets

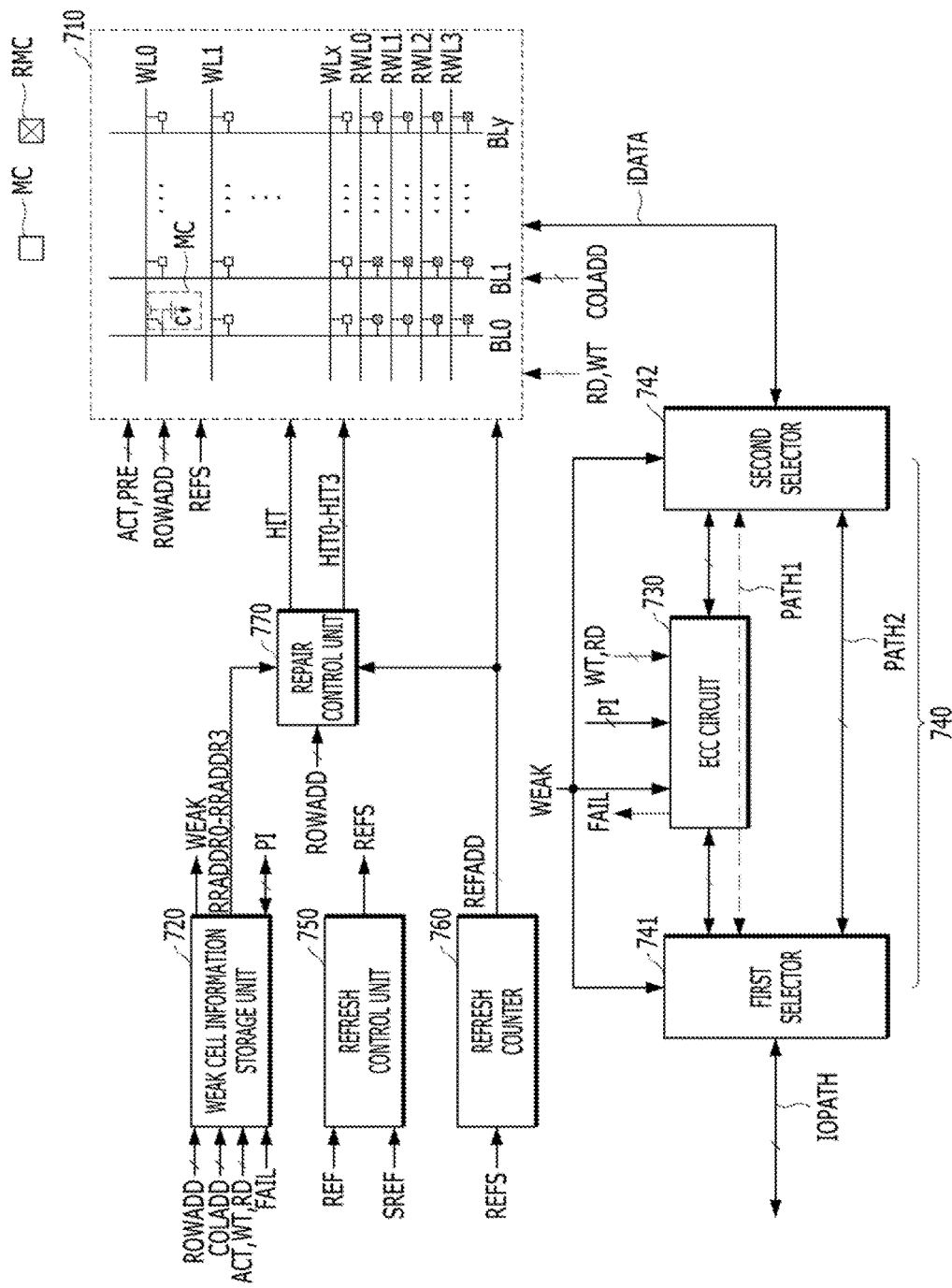

MEMORY DEVICE CORRECTING DATA ERROR OF WEAK CELL

CROSS-REFERENCE TO RELATED APPLICATIONS

The present application claims priority to Korean Patent Application No. 10-2016-0159171, filed on Nov. 28, 2016, which is herein incorporated by reference in its entirety.

BACKGROUND

1. Field

This patent document relates to a memory device.

2. Description of the Related Art

In general, a memory cell of a semiconductor memory device such as Dynamic Random Access Memory (DRAM) includes a transistor serving as a switch and a capacitor for storing a charge that is, data. Depending on whether the capacitor of the memory cell is charged or not, that is, whether the terminal voltage of the capacitor is high or low, the logic level of data may be high that is, logic 1 and low that is, logic 0.

Since data are stored in such a manner that charges are accumulated in the capacitor, no power is consumed in principle. However, due to a leakage current caused by a PN junction of a metal-oxide-semiconductor (MOS) transistor, the initial charge stored in the capacitor may disappear. In this case, the data may be lost. In order to prevent such a data loss, the data stored in the memory cell must be read before the data are lost, and the memory cell must be recharged according to the read information. Such an operation must be periodically repeated in order to retain the data. The process of recharging the memory cell is referred to as a refresh operation.

The refresh operation may be performed whenever a refresh command is received in a memory device which includes a plurality of memory cells, from a memory controller. Considering the data retention time of the memory device, the memory controller may transmit the refresh command to the memory device at each predetermined time. For example, when the data retention time of the memory device is 64 ms and the entire memory cells of the memory device can be refreshed only when the refresh command is received 8,000 times, the memory controller transmits 8,000 refresh commands to the memory device for 64 ms.

Furthermore, when the data retention times of some memory cells included in a memory device do not exceed a prescribed reference time during a test process of the memory device, the memory device is processed as a fail. The memory device processed as a fail must be discarded.

When memory devices including memory cells having data retention times which do not reach the reference time, that is, weak cells, are all processed as fails, the yield of the memory devices inevitably decreases. Furthermore, even a memory device having passed through a test may cause an error when a weak cell occurs due to a posterior cause.

Recently, as the number of memory cells integrated in one chip is increased to tens of millions or more, the possibility that weak cells will occur, increases more and more despite the development of the fabrication process. Unless an accurate test is performed on such weak cells, the reliability of the memory device cannot be secured. Thus, research is being conducted on various schemes and methods for detecting a weak cell.

SUMMARY

Various embodiments are directed to a memory device capable of correcting a data error of weak cells using an error correction code (ECC) circuit, thereby effectively managing the weak cells while increasing a refresh cycle.

In an embodiment, a memory device may include: a plurality of memory cells; a weak cell information storage unit suitable for storing a weak address and parity information corresponding to at least one weak cell having a shorter data retention time than a reference time, among the plurality of memory cells; an error correction code (ECC) circuit suitable for detecting and correcting an error bit of the at least one weak cell using the parity information; and a refresh control unit suitable for controlling the plurality of memory cells to be refreshed at a cycle equal to or more than the reference time.

In an embodiment, a memory device may include: a plurality of memory cells; at least one redundancy cell; a weak cell information storage unit suitable for storing a weak address and parity information corresponding to at least one weak cell having a shorter data retention time than a reference time, among the plurality of memory cells, and repair information corresponding to all or part of the at least one weak cell; an error correction code (ECC) circuit suitable for detecting and correcting an error bit of the at least one weak cell using the parity information; a refresh control unit suitable for controlling the plurality of memory cells to be refreshed at a cycle equal to or more than the reference time; and a repair control unit suitable for replacing a weak cell corresponding to the repair information among the at least one weak cell with the at least one redundancy cell, in response to the repair information.

BRIEF DESCRIPTION OF THE DRAWINGS

FIG. 7 is a diagram of a memory device in accordance with an embodiment.

DETAILED DESCRIPTION

Figure 1A:
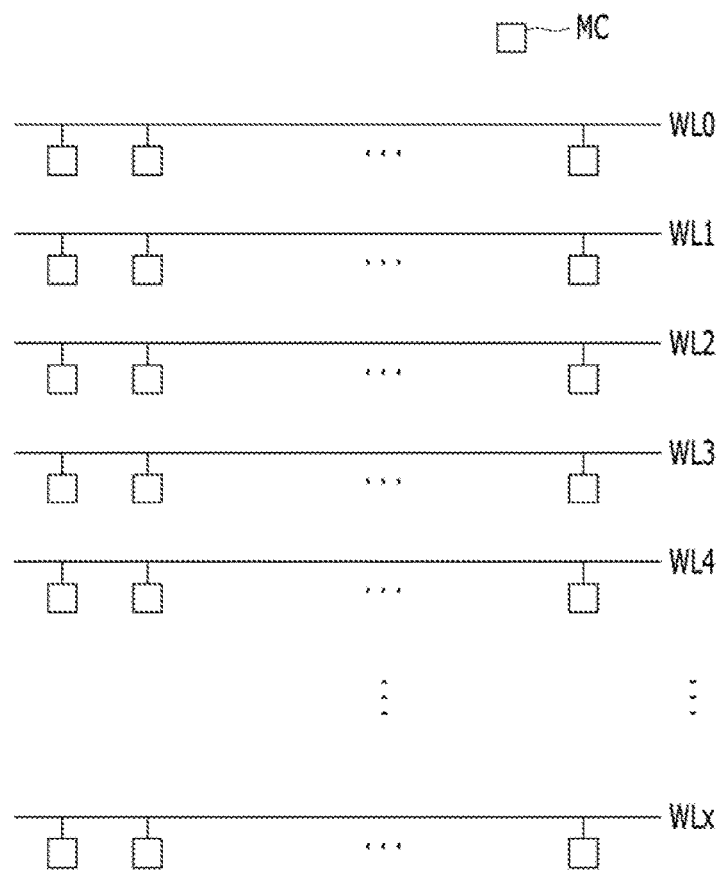
FIGS. 1A to 1D are diagrams illustrating a refresh operation and a weak cell in a memory device.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

FIGS. 1A to 1D are diagrams illustrating a refresh operation and a weak cell in a memory device. In FIGS. 1A to 1D, WL0 to WLn represent a plurality of word lines, REF represents a refresh command, a word line in a parenthesis indicates a word line which is refreshed in response to a refresh command REF, and WL_WEAK represent a weak word line.

Referring to FIG. 1A, the memory device may include the plurality of word lines WL0 to WLn, and a plurality of memory cells MC may be coupled to each of the word lines WL0 to WLn where n represents a natural number. A refresh operation may be performed on a word line basis. FIG. 1A omits an illustration of the other components for example, bit lines, excluding the word lines and the memory cells.

Figure 1B:
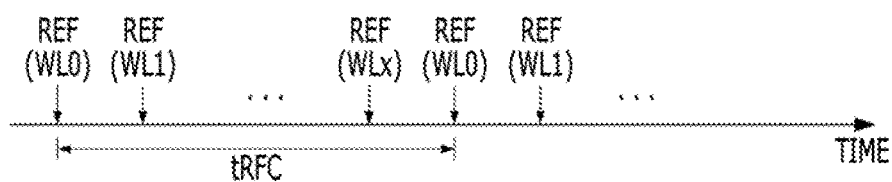
Figure 1C:
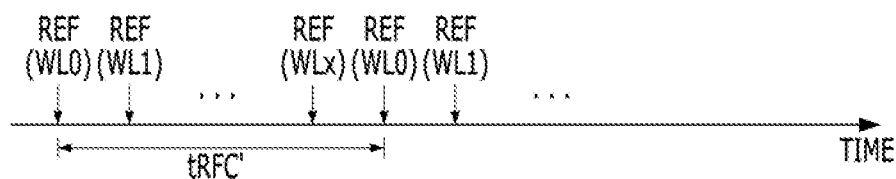

For example, one word line may be refreshed that is, activated and then precharged, when a refresh command REF is received in the memory device, and all word lines may be refreshed when refresh commands REF corresponding to the number of word lines are received. In this case, the refresh interval for one word line may correspond to (n+1) times an interval at which refresh commands are applied (FIG. 1B). The refresh interval for the word line may be referred to as tRFC, and (n+1) may correspond to the number of word lines. A weak cell may indicate a memory cell having data which may be deteriorated since the data retention time thereof is less than tRFC.

Figure 1D:
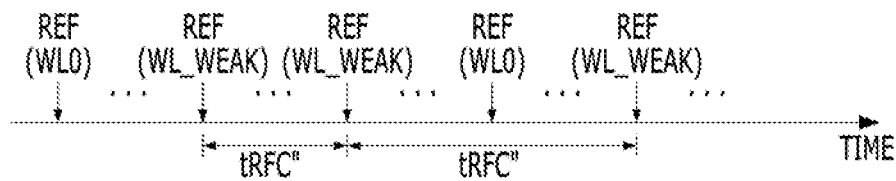

In general, tens or hundreds of weak cells are not concentrated, but several weak cells are spread over a plurality of word lines. That is, a normal word line has no weak cells among the memory cells coupled thereto. Although a word line has weak cells coupled thereto hereafter, weak word line, the weak word line includes only several weak cells. However, when the refresh cycles tRFC of all the word lines are reduced to tRFC', where tRFC<tRFC', in order to prevent a deterioration in data of weak cells (FIG. 1C), current consumption caused by refresh may be significantly increased. Furthermore, as illustrated in FIG. 1D, the refresh cycle of only a weak word line may be reduced from tRFC to tRFC", where tRFC>tRFC". In this case, the method can reduce current consumption in comparison to the above-described method, but unnecessary refresh current may be consumed for normal memory cells coupled to the weak word line.

Figure 2:
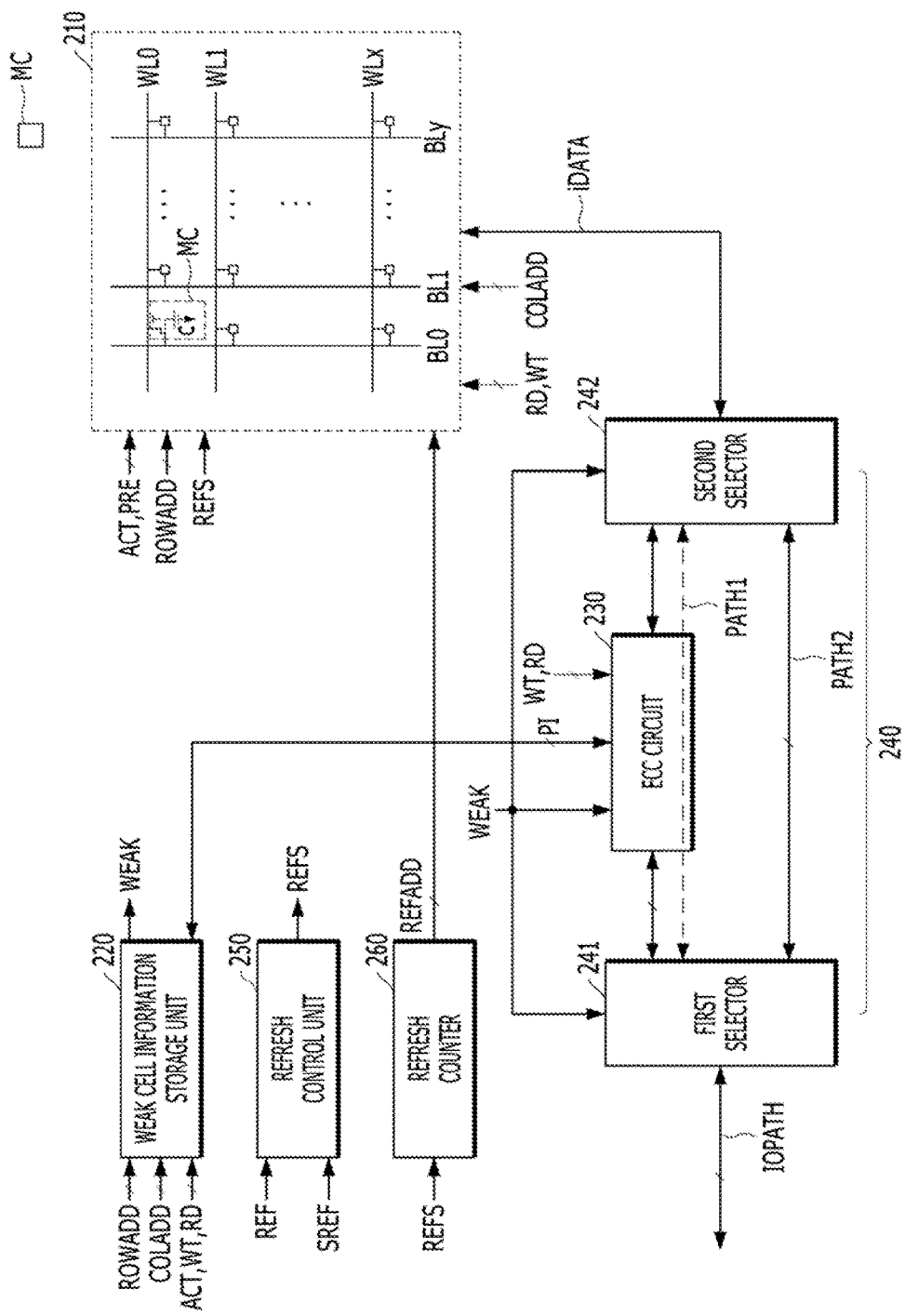
FIG. 2 is a diagram of a memory device in accordance with an embodiment.

FIG. 2 is a diagram of a memory device in accordance with an embodiment.

Referring to FIG. 2, the memory device may include a cell array 210, a weak cell information storage unit 220, an error correction code (ECC) circuit 230, a path selection unit 240, a refresh control unit 250 and a refresh counter 260.

The cell array 210 may include a plurality of word lines WL0 to WLx, a plurality of bit lines BL0 to BLy and a plurality of memory cells MC coupled between the word lines and the bit lines, where x and y are natural numbers. The numbers of word lines, bit lines and memory cells may be changed depending on design. The cell array 210 may further include circuits which control active and precharge operations of a word line selected in response to a row address ROWADD among the word lines WL0 to WLx, and control an operation of reading data of a bit line selected in response to a column address COLADD among the bit lines BL0 to BLy or writing data to a memory cell through the selected bit line. The circuits are not illustrated in FIG. 2.

The cell array 210 may activate a word line corresponding to the row address ROWADD in response to an active command ACT, and precharge the activated word line in response to a precharge command PRE. The cell array 210 may activate a word line corresponding to a refresh address REFADD when a refresh signal REFS is activated, and precharge the activated word line when the refresh signal REFS is deactivated.

The cell array 210 may output data of bit lines corresponding to the column address COLADD to the outside of the cell array 210 in response to a read command RD, and drive the bit lines corresponding to the column address COLADD to data inputted or received, from outside in response to a write command WT. The data inputted to the cell array 210 or outputted from the cell array 210 may be transmitted or received therebetween through an internal data path iDATA.

Each of the memory cells MC may include a cell transistor T and a cell capacitor C. Each memory cell MC may store data by charging the cell capacitor C. FIG. 2 does not illustrate the internal configurations of the other memory cells excluding one memory cell MC.

Each column address COLADD may correspond to two or more bit lines. When the column address COLADD corresponds to k bit lines, where k is a natural number equal to or more than 2, data of the k bit lines corresponding to the column address COLADD may be simultaneously outputted from the cell array 210 during a read operation, and data may be simultaneously transmitted to the k bit lines corresponding to the column address COLADD during a write operation. Thus, k data may be inputted to or outputted from the cell array 210 at the same time.

The weak cell information storage unit 220 may store various pieces of information related to weak cells. The weak cell information storage unit 220 may store the weak address or weak addresses of one or more weak cells having a data retention time shorter than a reference time and parity information corresponding to the weak cells. Each of the weak addresses may include a row address WRADD of the corresponding weak cell and a column address WCADD of the weak cell. Hereafter, the row address WRADD of the weak cell will be referred as a weak row address, and the column address WCADD of the weak cell will be referred to as a weak column address. The weak row address WRADD may indicate the address of a word line to which a weak cell is coupled, and the weak column address WCADD may indicate the address of a bit line to which a weak cell is coupled. The parity information corresponding to a weak cell may be used to detect and correct a data error in the weak cell.

For reference, the parity information is one or more-bit information for detecting and correcting an error bit of data, and may have a bit number that is set with respect to the bit number of the data. In general, one-bit parity information may be used to detect and correct an error included in 8-bit data. Thus, the bit number of the parity information may be decided according to the number of memory cells corresponding to a weak row address and weak column address. For example, when the number of memory cells corresponding to the weak row address and weak column address is 64, the bit number of data inputted to the cell array 210 in response to one write command or data outputted from the cell array 210 in response to one read command, may be set to 64 bits. In this case, 8-bit parity information for detecting and correcting an error of the 64-bit data may be generated through ECC encoding, and the error of the 64-bit data may be detected and corrected through ECC decoding based on the 8-bit parity information.

The bit number of data, the bit number of parity information corresponding to the data or the bit number of data inputted/outputted in response to one write/read command may be changed depending on design.

The reference time may be set in connection with the refresh cycle of the memory device. For example, when the refresh cycle of the memory device is 64 ms, the reference time may be set to 64 ms. However, the reference time does not need to be equal to the refresh cycle, but may be set to a shorter time for example, 16 ms or 32 ms than the reference cycle or a longer time for example, 128 ms or 192 ms than the reference cycle. Hereafter, referring to FIG. 3, the configuration and operation of the weak cell information storage unit 220 will be described.

Figure 3:
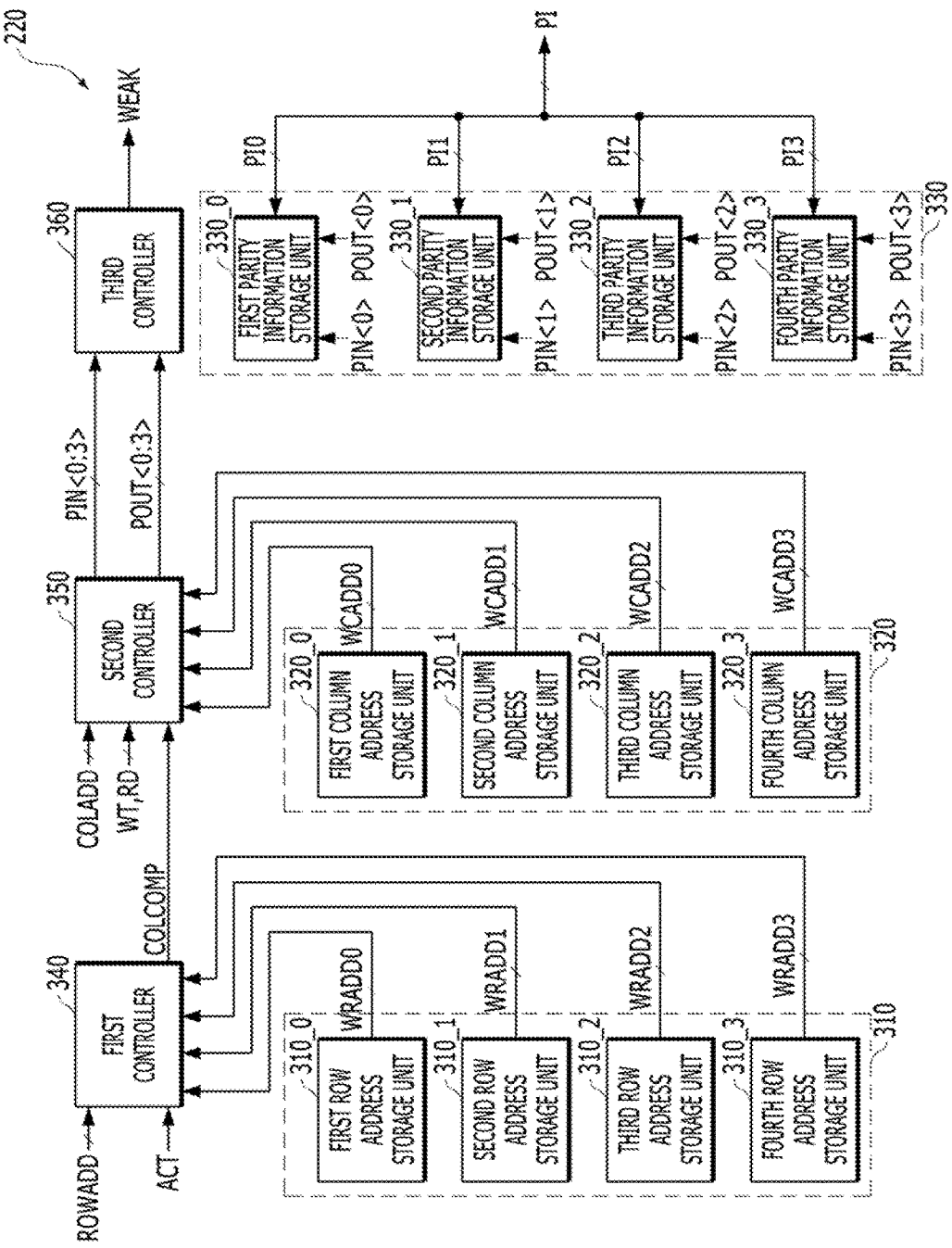
FIG. 3 is a diagram of a weak cell information storage unit in accordance with an embodiment.

FIG. 3 is a diagram of the weak cell information storage unit 220 in FIG. 2 in accordance with an embodiment.

Referring to FIG. 3, the weak cell information storage unit 220 may include first to third regions 310 to 330 and first to third controllers 340 to 360.

The first region 310 may include first to fourth row address storage units 310_0 to 310_3. Each of the row address storage units 310_0 to 310_3 may store one weak row address, and output the weak row address stored therein.

The second region 320 may include first to fourth column address storage units 320_0 to 320_3. Each of the column address storage units 320_0 to 320_3 may store one weak column address, and output the weak column addresses stored therein.

The third region 330 may include first to fourth parity information storage units 330_0 to 330_3. The first parity information storage unit 330_0 may store parity information PI0 of data stored in memory cells including weak cells, corresponding to the weak row and column addresses WRADD0 and WCADD0 stored in the first row address storage unit 310_0 and the first column address storage unit 320_0, respectively. The second parity information storage unit 330_1 may store parity information PI1 of data stored in memory cells including weak cells, corresponding to the weak row and column addresses WRADD1 and WCADD1 stored in the second row address storage unit 310_1 and the second column address storage unit 320_1, respectively. The third parity information storage unit 330_2 may store parity information PI2 of data stored in memory cells including weak cells, corresponding to the weak row and column addresses WRADD2 and WCADD2 stored in the third row address storage unit 310_2 and the third column address storage unit 320_2, respectively. The fourth parity information storage unit 330_3 may store parity information PI3 of data stored in memory cells including weak cells, corresponding to the weak row and column addresses WRADD3 and WCADD3 stored in the fourth row address storage unit 310_3 and the fourth column address storage unit 320_3, respectively.

Each of the first to fourth parity information storage units 330_0 to 330_3 may correspond to one input signal of a plurality of input signals PIN<0:3> and one output signal of a plurality of output signals POUT<0:3>. Each of the first to fourth parity information storage units 330_0 to 330_3 may store parity information PI inputted from an outside when the corresponding input signal is activated, and output the parity information PI stored therein to the outside when the corresponding output signal is activated. Here, 'PI' may represent parity information inputted to the weak cell information storage unit 220 or outputted from the weak cell information storage unit 220.

When an active command ACT is applied, the first controller 340 may compare the weak row addresses WRADD0 to WRADD3 with the row address ROWADD, and activate or deactivate a in comparison signal COLCOMP according to the comparison result. When the weak row addresses WRADD0 to WRADD3 include the same weak row address as the row address ROWADD, the first controller 340 may activate the column comparison signal COLCOMP. Otherwise, the first controller 340 may deactivate the column comparison signal COLCOMP. For reference, the column comparison signal COLCOMP may retain an active state until the next active command ACT is applied.

The second controller 350 may compare the weak column addresses WCADD0 to WCADD3 with the column address COLADD while the column comparison signal COLCOMP is activated, and activate one signal among the plurality of input signals PIN<0:3> and the plurality of output signals POUT<0:3> or deactivate all the signals, according to the comparison result.

When a write command WT is applied while the column comparison signal COLCOMP is enabled, the second controller 350 may activate an input signal corresponding to the same weak column address as the column address COLADD, among the plurality of input signals PIN<0:3>, when the weak column addresses WCADD0 to WCADD3 include the same weak column address as the column address COLADD. The second controller 350 may not activate the plurality of input signal's PIN<0:3> when such a weak column address is not present.

When a read command RD is applied while the column comparison signal COLCOMP is activated, the second controller 350 may activate an output signal corresponding to the same weak column address as the column address COLADD, among the plurality of output signals POUT<0:3>, when the weak column addresses WCADD0 to WCADD3 include the same weak column address as the column address COLADD. The second controller 350 may not activate the plurality of output signals POUT<0:3> when such a weak column address is not present.

The third controller 360 may activate a weak signal WEAK when one or more signals among the plurality of input signals PIN<0:3> and the plurality of output signals POUT<0:3> are activated. The third controller 360 may not activate the weak signal WEAK when no signals among the plurality of input signals PIN<0:3> and the plurality of output signals POUT<0:3> are enabled. The weak signal WEAK indicating whether a weak cell is included in memory cells to or from which data are to be read or written may be used as a signal for selecting a path of data inputted to the cell array 210 or outputted from the cell array 210.

Referring again to FIG. 2, the ECC circuit 230 may detect and correct an error bit or error bits of one or more weak cells using the parity information PI. The ECC circuit 230 may generate the parity information PI by ECC encoding data inputted during a write operation. Furthermore, the ECC circuit 230 may generate error-corrected data by ECC decoding data outputted from a weak cell and the parity information PI during a read operation. The ECC circuit 230 may perform error correction using one coded modulation such as low density parity check (LDDC) code, Bose-Chaudhri-Hocquenghem (BCH) code, turbo code, Reed-Solomon code, convolution code, recursive systematic code (RSC), trellis-coded modulation (TCM) or block coded modulation (BCM). However, the ECC circuit 230 is not limited thereto. The ECC circuit 230 may include a circuit, system or device for error correction.

The ECC circuit 230 may perform an ECC encoding operation when the weak signal WEAK is activated and the write command WT is applied, and perform an ECC decoding operation when the weak signal WEAK is activated and the read command RD is applied. The ECC circuit 230 may not perform the ECC encoding operation or the ECC decoding operation when the weak signal WEAK is deactivated.

The path selection unit 240 may select one of first and second data paths PATH1 and PATH2. The path selection unit 240 may select the first data path PATH1 to pass data inputted to or outputted from a weak cell, or select the second data path PATH2 to pass data inputted to or outputted from a normal cell except for the weak cell. The path selection unit 240 may include first and second selectors 241 and 242.

When the weak signal WEAK is activated, the first selector 241 may couple the first data path PATH1 to a data path IOPATH connected to the outside of the memory device. Hereafter, the data path IOPATH will be referred to as an input/output path. On the other hand, when the weak signal WEAK is deactivated, the first selector 241 may couple the second data path PATH2 to the input/output path IOPATH. When the weak signal WEAK is activated, the second selector 242 may couple the internal data path iDATA and the first data path PATH1. Alternatively, when the weak signal WEAK is deactivated, the second selector 242 may couple the internal data path iDATA and the second data path PATH2.

The first data path PATH1 may serve to guide data inputted to or outputted from the cell array 210 such that the data pass through the ECC circuit 230. The second data path PATH1 may serve to guide data inputted to or outputted from the cell array 210 such that the data do not pass through the ECC circuit 230.

The refresh control unit 250 may activate the refresh signal REFS for a predetermined time, when the refresh command REF is applied. The refresh control unit 250 may periodically activate the refresh signal REFS while a self refresh signal SREF is enabled. The refresh command REF may be applied at a first cycle. Furthermore, the first cycle may correspond to a value obtained by dividing the refresh cycle by the number of word lines. The self refresh signal SREF may be activated during a self refresh operation which the memory device internally performs without an external command, and the refresh control unit 250 may activate the refresh signal REFS at a second cycle while the self refresh signal SREF is enabled. The first cycle may correspond to a value obtained by dividing the refresh cycle by the number of word lines.

The refresh counter 260 may perform counting in response to the refresh signal REFS, and generate a refresh address REFADD. More specifically, the refresh counter 260 may perform counting in response to an inactive edge for example, a falling edge of the refresh signal REFS. The refresh counter 260 may increase the value of the refresh address REFADD by 1 through counting. When the value of the refresh address REFADD is increased by 1, it may indicate that the refresh address REFADD is changed to select a (k+1)th word line next time if a k-th word line was selected this time, where k is a natural number.

The memory device of FIG. 2 may detect and correct a data error in a weak cell, using the ECC circuit 230. Since the refresh cycle becomes longer than the data retention time of the weak cell, the memory device can correct the error, even though a part of the data stored in the weak cell is lost. Thus, although a plurality of memory cells MC including the weak cell are refreshed at a refresh cycle longer than the data retention time of the weak cell, no errors may occur. That is, while properly managing the weak cells, the memory device can increase the refresh cycle, thereby reducing power and current consumption caused by the refresh operation.

Figure 4A:
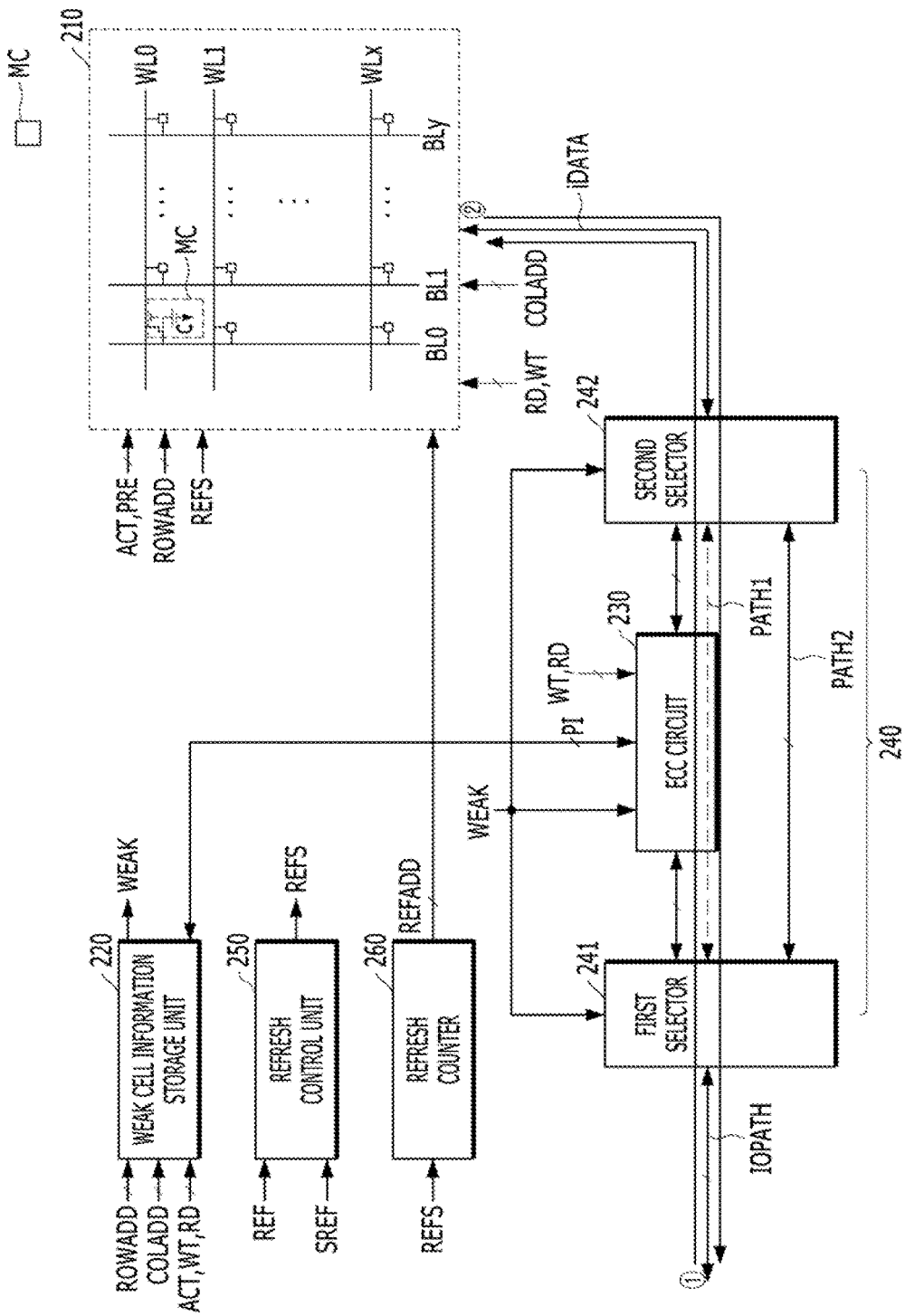
FIG. 4A is a diagram illustrating an operation of the memory device shown in FIG. 2 using a first data path PATH1.

FIG. 4A is a diagram illustrating the operation of the memory device in FIG. 2 using the first data path PATH1.

When the row address ROWADD inputted with the active command ACT is identical to a weak row address WRADD and the column address COLADD inputted with the write command WT is identical to a weak column address WCADD, the weak cell information storage unit 220 may activate the weak signal WEAK, and the first data path PATH1 may be selected.

Data inputted with the write command WT may be inputted to the ECC circuit 230 through the input/output path IOPATH and the first selector 241. The ECC circuit 230 may generate parity information PI by ECC encoding the inputted data, and output the encoded data to the second selector 242. The parity information PI may be transmitted and stored into the weak cell information storage unit 220, and the data may be transmitted to the cell array 210 through the internal data path iDATA and stored in memory cells corresponding to the row address ROWADD and the column address COLADD.

When the row address ROWADD inputted with the active command ACT is identical to a weak row address WRADD and the column address COLADD inputted with the read command RD is identical to a weak column address WCADD, the weak cell information storage unit 220 may enable the weak signal WEAK, and the first data path PATH1 may be selected. The weak cell information storage unit 220 may output the parity information P1.

Data outputted from the cell array 210 in response to the read command RD may be inputted to the ECC circuit 230 through the internal data path DATA and the second selector 242, and the parity information PI outputted from the weak cell information storage unit 220 may be inputted to the ECC circuit 230. The ECC circuit 230 may generate error-corrected data using the inputted data and the parity information PI, and output the error-corrected data to the first selector 241. The error-corrected data in the first selector 241 may be outputted to the outside of the memory device through the input/output path IOPATH.

In FIG. 4A, ① may represent a data transfer direction during the write operation, and ② may represent a data transfer direction during the read operation.

Figure 4B:
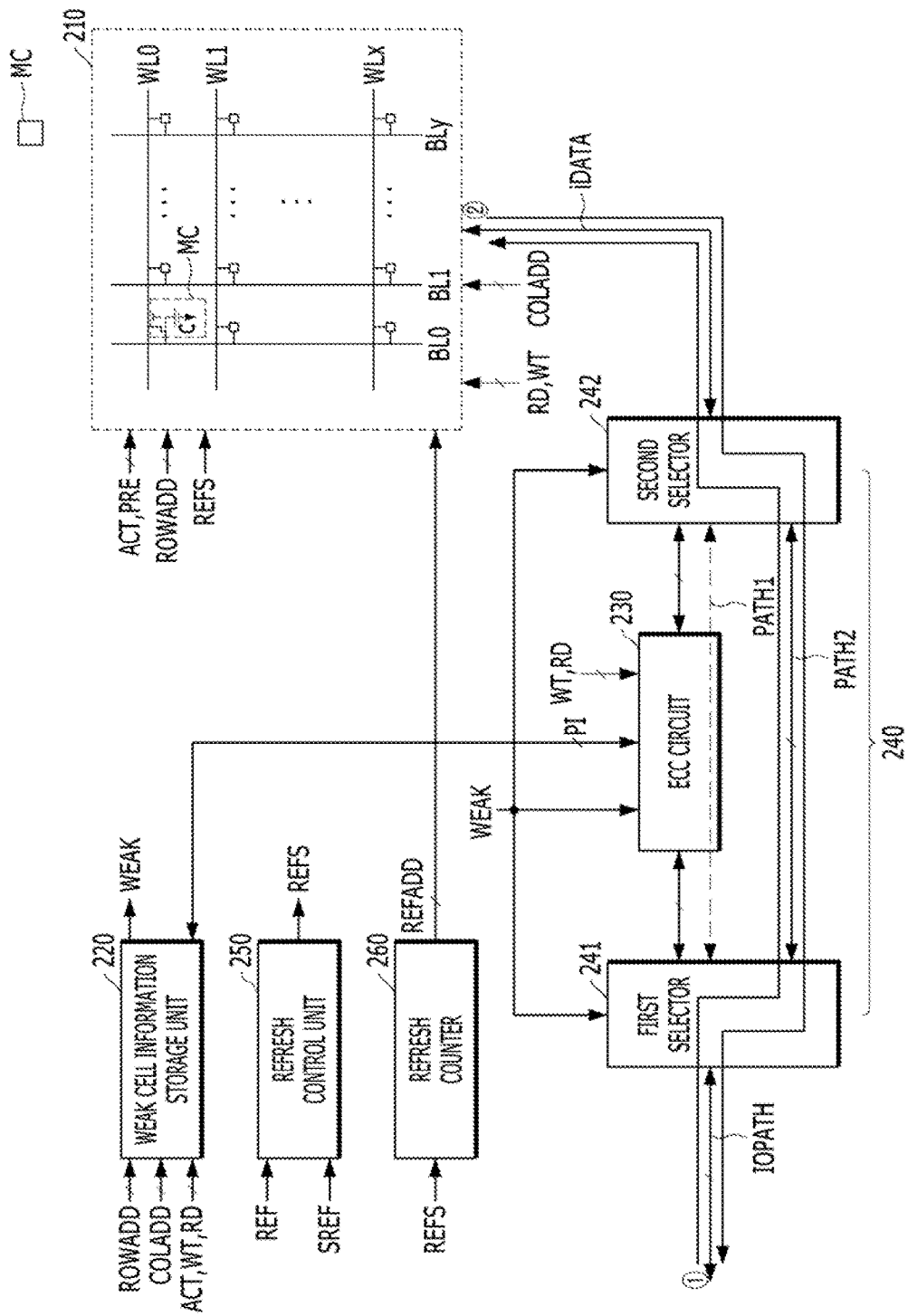
FIG. 4B is a diagram illustrating an operation of the memory device shown in FIG. 2 using a second data path PATH2.

FIG. 4B is a diagram illustrating the operation of the memory device in. FIG. 2 using the second data path PATH2, When the row address ROWADD inputted with the active command ACT is different from a weak row address WRADD and the column address COLADD inputted with the write command WT is different from a weak column address WCADD, the weak cell information storage unit 220 may deactivate the weak signal WEAK, and the second data path PATH2 may be selected.

Data inputted with the write command WT may be transmitted to the cell array 210 through the input/output path IOPATH, the first selector $41 and the second selector 242, and stored in memory cells corresponding to the row address ROWADD and the column address COLADD.

When the row address ROWADD inputted with the active command ACT is different from a weak row address WRADD, and the column address COLADD inputted with the read command RD is different from a weak column address WCADD, the weak cell information storage unit 220 may deactivate the weak signal WEAK, and the second data path PATH2 may be selected.

Data outputted from the cell array 210 in response to the read command RD may be outputted to the outside through the input/output path IOPATH via the internal data path iDATA, the second selector 242 and the first selector 241.

In FIG. 4B, ① may represent a data transfer direction during the write operation, and ② may represent a data transfer direction during the read operation.

As described with reference to FIGS. 4A and 4B, the data inputted to or outputted from the weak cell and the data inputted to or outputted from the other memory cells may be transmitted through different paths. Thus, the time required for transmitting the data inputted to or outputted from the weak cell may be different from the time required for transmitting the data inputted to or outputted from the other memory cells. That is, the data inputted to or outputted from the weak cell may be delayed by the operation time of the ECC circuit 230, compared to the data inputted to or outputted from the other memory cells excluding the weak cell.

Figure 5:
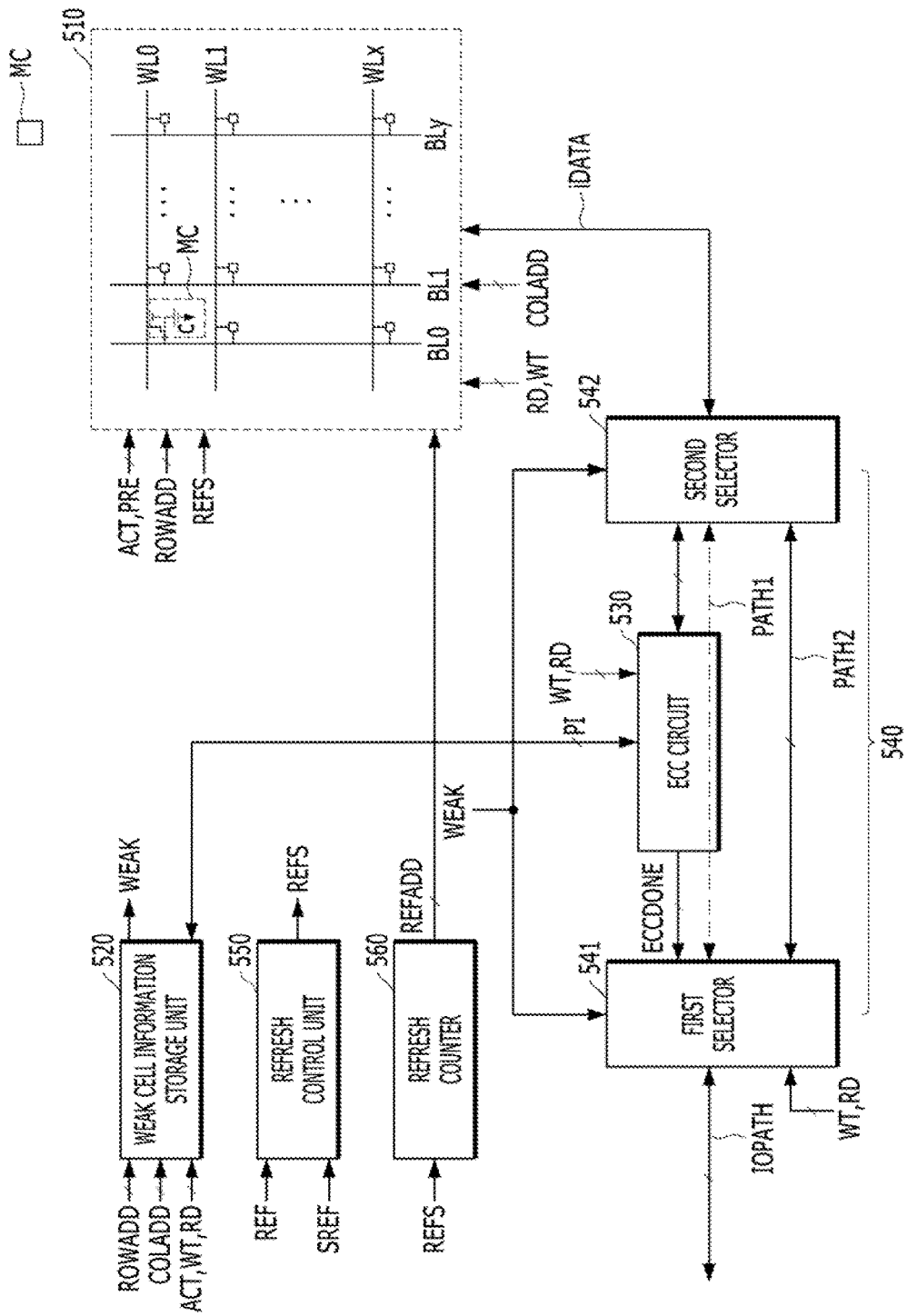
FIG. 5 is a diagram of a memory device in accordance with an embodiment.

FIG. 5 is a diagram of a memory device in accordance with another embodiment.

Referring to FIG. 5, the memory device may include a cell array 510, a weak cell information storage unit 520, an error correction code (ECC) circuit 530, a path selection unit 540, a refresh control unit 550 and a refresh counter 560.

The cell array 510, the weak cell information storage unit 520, the refresh control unit 550 and the refresh counter 560 may be configured and operated in the same manner as the cell array 210, the weak cell information storage unit 220, the refresh control unit 250 and the refresh counter 260 in FIG. 2.

The ECC circuit 530 may perform an ECC encoding operation when a write command WT is applied, and perform an ECC decoding operation when a read command RD is applied. The ECC circuit 530 may enable a done signal ECCDONE when the ECC encoding operation or ECC decoding operation is done.

The ECC circuit 530 may perform the ECC encoding/decoding operation regardless of whether the weak signal WEAK is activated/deactivated, unlike the ECC circuit 230 of FIG. 2. However, when the weak signal WEAK is deactivated, the ECC circuit 530 may neither receive actual data to generate parity information PI, nor correct and detect an error using the parity information PI. In this case, the operation of the ECC circuit 530 may be referred to as a dummy ECC encoding or dummy ECC decoding operation. Through the dummy ECC encoding/decoding operation, the parity information PI or error-corrected data may not be generated. After the dummy ECC encoding/decoding operation is completed, only the done signal ECCDONE may be activated. At this time, the time required for performing the ECC encoding operation may be equal to the time required for performing the dummy ECC encoding operation, and the time required for performing the ECC decoding operation may be equal to the time required for performing the dummy ECC decoding operation.

The path selection unit 540 may select one of first and second data paths PATH1 and PATH2. The path selection unit 540 may select the first data path PATH1 to pass data inputted to or outputted from a weak cell, or select the second data path PATH2 to pass data inputted to or outputted from other memory cells except for the weak cell. The data passed through the second data path PATH2 may be delayed by the operation time of the ECC circuit.

The path selection unit 540 may include first and second selectors 541 and 542. The second selector 542 may couple an internal data path iDATA to the first data path PATH1 when the weak signal WEAK is activated, and connect the internal data path iDATA to the second data path PATH2 when the weak signal WEAK is deactivated.

When a write command WT is applied, the first selector 541 may receive data through the input/output path IOPATH. When the weak signal WEAK is activated, the first selector 541 may immediately output the data received in response to the write command WT to the first data path PATH1. When the weak signal WEAK is deactivated, the first selector 541 may output the data received in response to the write command WT to the second data path PATH2 when the done signal ECCDONE is activated.

When the weak signal WEAK is activated and a read command RD is applied, the first selector 541 may receive data of the first data path PATH1 when the done signal ECCDONE is enabled, and immediately output the received data to the input/output path IOPATH. When the weak signal WEAK is deactivated and the read command RD is applied, the first selector 541 may receive and store data of the second data path PATH2, and immediately output the stored data to the input/output path IOPATH when the done signal ECCDONE is enabled.

Figure 6A:
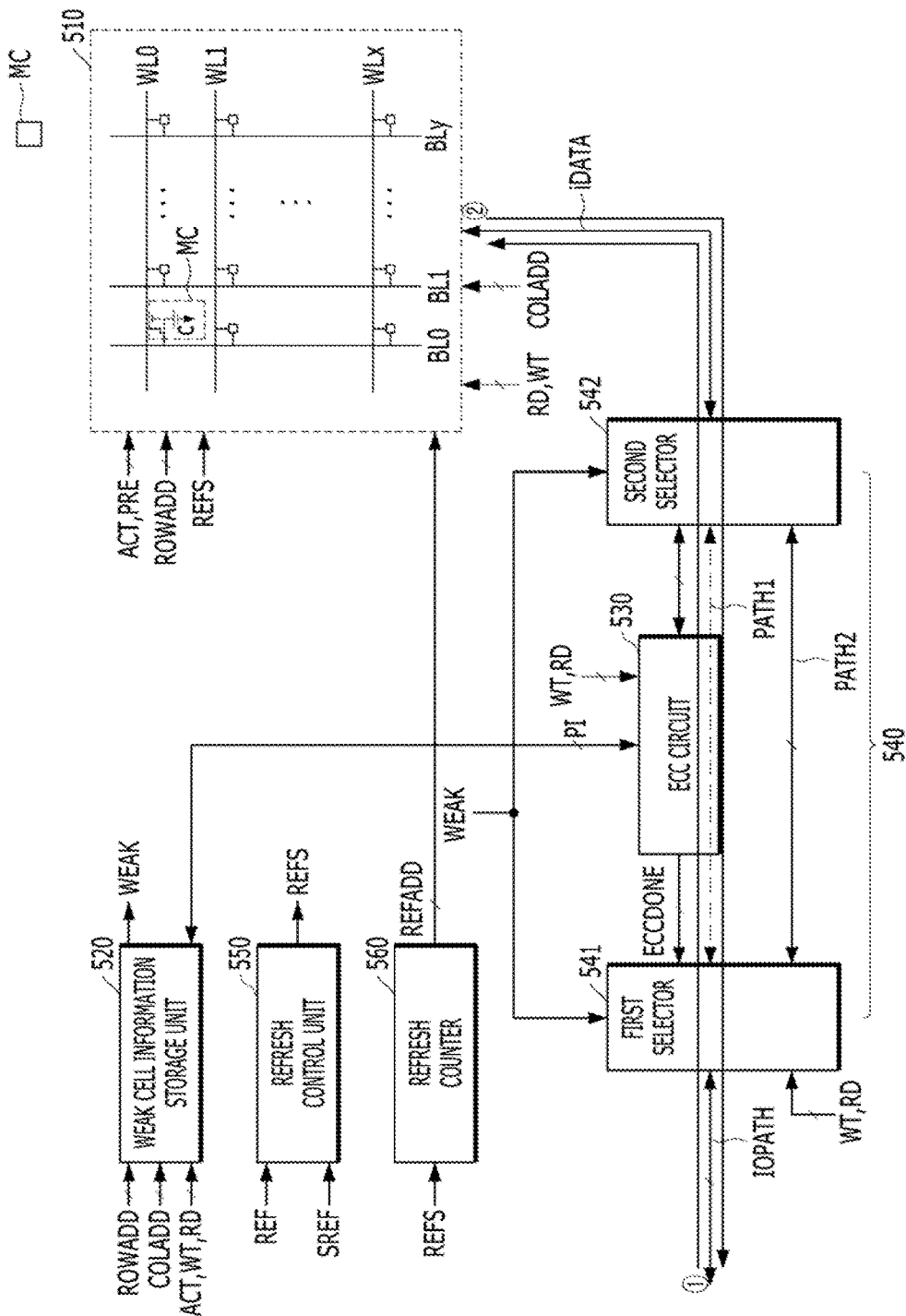
FIG. 6A is a diagram illustrating an operation of the memory device shown in FIG. 5 using a first data path PATH1.

FIG. 6A is a diagram illustrating the operation of he memory device in FIG. 5 using the first data path PATH1.

When the row address ROWADD inputted with the active command ACT is identical to a weak row address WRADD and the column address COLADD inputted with the write command WT is identical to a weak column address WCADD, the weak cell information storage unit 520 may activate the weak signal WEAK, and the first data path PATH1 may be selected.

Data inputted with, the write command WT may be inputted to the ECC circuit 530 through the input/output path IOPATH and the first selector 541. The ECC circuit 530 may generate the parity information PI by ECC encoding the inputted data, and output the encoded data to the second selector 542. The parity information PI may be transmitted and stored into the weak cell information storage unit 520, and the data may be transmitted to the cell array 510 through the internal data path iDATA and stored in memory cells corresponding to the row address ROWADD and the column address COLADD.

When the row address ROWADD inputted with the active command ACT is identical to a weak row address WRADD and the column address COLADD inputted with the read command RD is identical to a weak column address WCADD, the weak cell information storage unit 520 may activate the weak signal WEAK, and the first data path PATH1 may be selected. The weak cell information storage unit 520 may output the parity information PI.

Data outputted from the cell array 510 in response to the read command RD may be inputted to the ECC circuit 530 through the internal data path iDATA and the second selector 542, and the parity information PI outputted from the weak cell information storage unit 520 may be inputted to the ECC circuit 530. The ECC circuit 530 may generate error-corrected data using the inputted data and the parity information PI, and output the error-corrected data to the first selector 541. The error-corrected data in the first selected 541 may be outputted to the outside of the memory device through the input/output path IOPATH.

In FIG. 6A, ① may represent a data transfer direction during the write operation, and ② may represent a data transfer direction during the read operation.

Figure 6B:
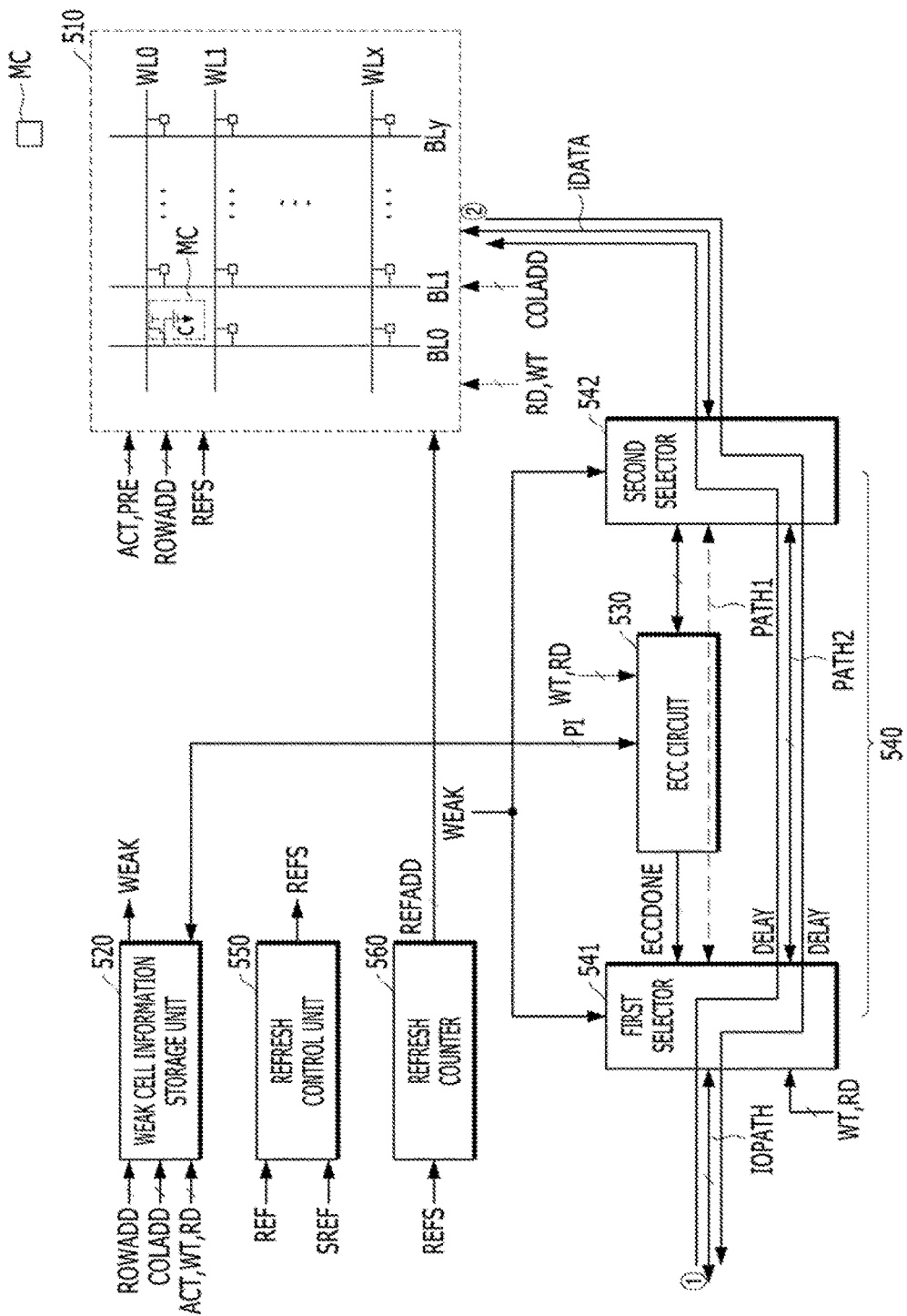
FIG. 6B is a diagram illustrating an operation of the memory device shown in FIG. 5 using a second data path PATH2.

FIG. 6B is a diagram illustrating the operation of the memory device in FIG. 5 using the second data path PATH2.

When the row address ROWADD inputted with the active command ACT is different from a weak row address WRADD and the column address COLADD inputted with the write command WT is different from a weak column address WCADD, the weak cell information storage unit 520 may deactivate the weak signal WEAK, and the second data path PATH2 may be selected.

Data inputted with the write command WT may be transmitted to the cell array 510 through the input/output path IOPATH, the first selector 541 and the second selector 542, and stored in memory cells corresponding to the row address ROWADD and the column address COLADD. The data inputted to the first selector 541 through the input/output path IOPATH may be delayed by the operation time of the ECC circuit 530, and then transmitted to the cell array 510 through the second selector 542. The operation time may correspond to the operation time of the ECC encoding operation.

When the row address ROWADD inputted with the active command ACT is different from a weak row address WRADD and the column address COLADD inputted with the read command RD is different from a weak column address WCADD, the weak cell information storage unit 520 may deactivate the weak signal WEAK, and the second data path PATH2 may be selected.

Data outputted from the cell array 510 in response to the read command RD may be outputted to the outside of the memory device through the input/output path IOPATH via the internal data path iDATA, the second selector 542 and the first selector 541. The data transmitted to the first selector 541 from the second selector 542 may be delayed by the operation time of the ECC circuit 530, and then outputted to the outside of the memory device through the input/output path IOPATH. The operation time may correspond to the operation time of the ECC decoding operation.

In FIG, 6B, ① may represent a data transfer direction during the write operation, and ② may represent a data transfer direction during the read operation. During the write operation and the read operation, the data may be delayed by the first selector 541.

As described with reference to FIGS. 6A and 6B, although the data inputted to or outputted from the weak cell and the data inputted to or outputted from the other memory cells are transmitted through different paths, the path selection unit 540 may delay the data inputted to or outputted from the other memory cells by the operation time of the ECC circuit 530. Thus, the data inputted to or outputted from the weak cell and the data inputted to or outputted from the other memory cells can be transmitted at the same time.

FIG. 7 is a diagram of a memory device in accordance with yet another embodiment.

Referring to FIG. 7, the memory device may include a cell array 710, a weak cell information storage unit 720, an error correction code (ECC) circuit 730, a path selection unit 740, a refresh control unit 750, a refresh counter 760 and a repair control unit 770.

The cell array 710 may include a plurality of word lines WL0 to WLx, a plurality of redundancy word lines RWL0 to RWL3, a plurality of bit lines BL0 to BLy, a plurality of memory cells MC coupled between the word lines WL0 to WLx and the bit lines BL0 to BLy, and a plurality of redundancy cells RMC coupled between the redundancy word lines RWL0 to RWL3 and the bit lines BL0 to BLy, where x and y are natural numbers. The numbers of word lines, redundancy word lines, bit lines, memory cells and redundancy cells may be changed depending on design.

When a hit signal HIT is deactivated, the cell array 710 may control active and precharge operations of a word line selected in response to a row address ROWADD, among the word lines WL0 to WLx. When the hit signal HIT is activated, the cell array 710 may control active and precharge operations of a redundancy word line selected in response to an activated redundancy select signal for example, one of HIT0 to HIT3, among the redundancy word lines RWL0 to RWL3. The cell array 710 may further include circuits that control an operation of reading data of a bit line selected in response to a column address COLADD among the bit lines BL0 to BLy, or writing data to a memory cell through the selected bit line. The circuits are not illustrated in FIG. 7.

When the hit signal HIT is deactivated, the cell array 710 may activate a word line corresponding to the row address ROWADD in response to an active command ACT, and precharge the activated word line in response to a precharge command PRE. Furthermore, when the hit signal HIT is deactivated, the cell array 710 may activate a word line corresponding to a refresh address REFADD when a refresh signal REFS is activated, and precharge the activated word line when the refresh signal REFS is deactivated.

When the hit signal HIT is activated, the cell array 710 may activate a redundancy word line corresponding to an activated redundancy select signal for example, one of HIT0 to HIT3, in response to the active command ACT, and precharge the activated redundancy word line in response to the precharge command PRE. Furthermore, when the hit signal HIT is activated, the cell array 710 may activate a redundancy word line corresponding to the activated redundancy select signal for example, one of HIT0 to HIT3, when the refresh signal REFS is activated, and precharge the activated redundancy word line when the refresh signal REFS is deactivated.

The cell array 710 may output data of bit lines corresponding to the column address COLADD to the outside of the cell array 710 in response to a read command RD, and drive the bit lines corresponding to the column address COLADD to data inputted from outside in response to a write command WT. The data inputted to the cell array 710 or outputted from the cell array 710 may be transmitted through an internal data path iDATA. The redundancy cell RMC may have the same internal structure as the memory cell MC illustrated in FIG. 2.

The weak cell information storage unit 720 may store various pieces of information related to a weak cell. The weak cell information storage unit 720 may store a weak row address, a weak column address, parity information corresponding to the weak cell and repair information corresponding to the weak cell. The repair information may be required to repair the weak cell with a redundancy cell. The weak cell information storage unit 720 may store repair information of weak cells of which errors cannot be corrected through a decoding operation of the ECC circuit 230. Hereafter, a case in which the repair information is the row address of a weak cell of which an error cannot be corrected will be exemplified.

Figure 8:
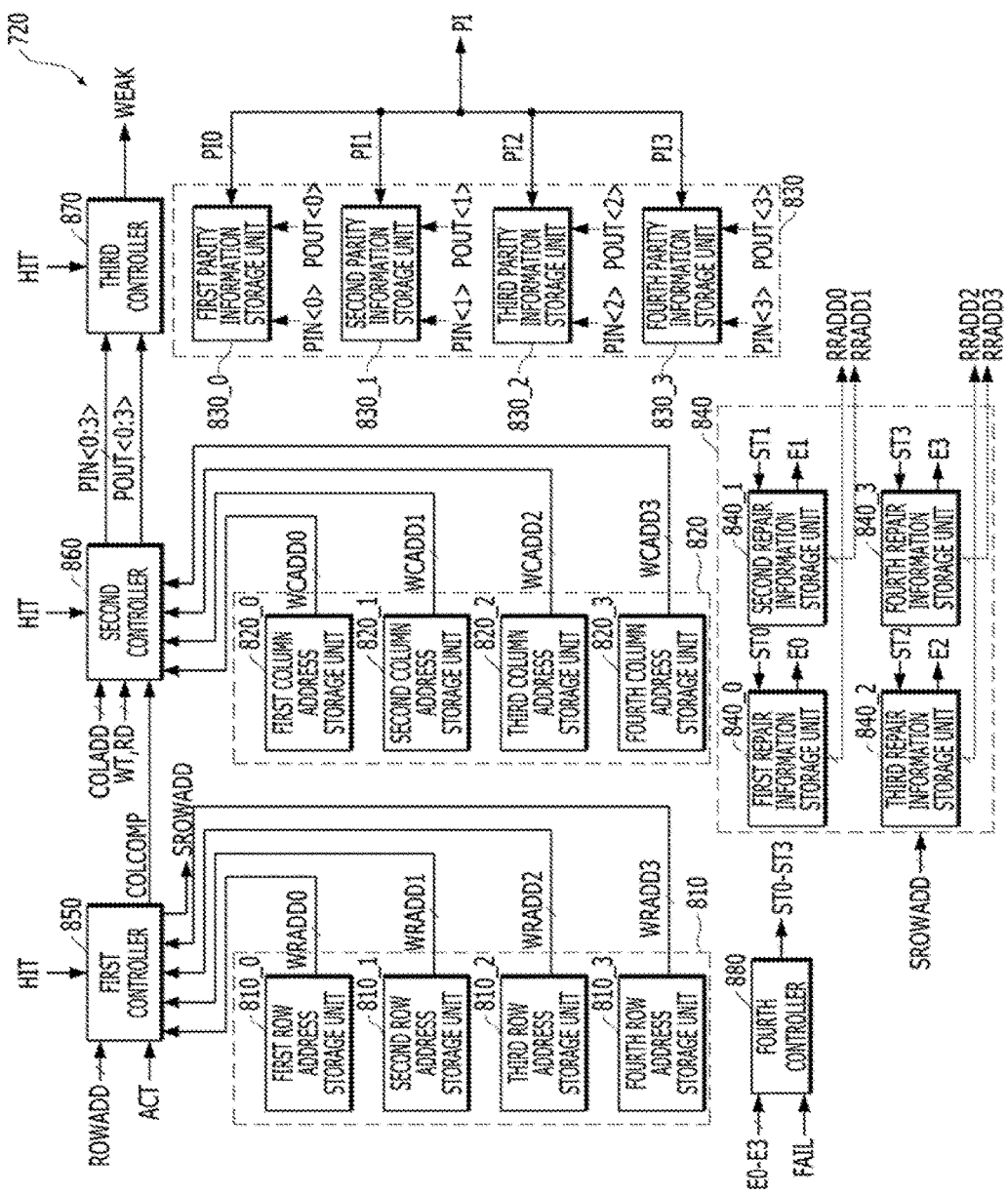
FIG. 8 is a diagram of a weak cell information storage unit in accordance with a first example.

FIG. 8 is a diagram of the weak cell information storage unit 720 in accordance with a first example.

Referring to FIG. 8, the weak cell information storage unit 720 may include first to fourth regions 810 to 840 and first to fourth controllers 850 to 880.

The first region 810 may include first to fourth row address storage units 810_0 to 810_3. Each of the row address storage units 810_0 to 810_3 may store one weak row address WRADD, and output the weak row address WRADD stored therein. The second region 820 may include first to fourth column address storage units 820_0 to 820_3. Each of the column address storage units 820_0 to 820_3 may store one weak column address WCADD, and output the weak column address WCADD stored therein.

The third region 830 may include first to fourth parity information storage units 830_0 to 830_3. Each of the first to fourth parity information storage units 830_0 to 830_3 may correspond to one row/column address storage unit, and store parity information of data of memory cells corresponding to the weak row/column address stored in the corresponding row/column address storage unit, the memory cells including a weak cell. Furthermore, each of the first to fourth parity information storage units 830_0 to 830_3 may store parity information PI in response to the corresponding input signal among a plurality of input signals PIN<0:3>, and output the stored parity information PI in response to the corresponding output signal among a plurality of output signals POUT<0:3>.

When the active command ACT is applied, the first controller 850 may compare the weak row addresses WRADD0 to WRADD3 with the row address ROWADD, and activate or deactivate a column comparison signal COLCOMP according to the comparison result. The second controller 860 may compare the weak column addresses WCADD0 to WCADD3 with the column address CO ADD while the column comparison signal COLCOMP is activated, and activate one signal among the plurality of input signals PIN<0:3> and the plurality of output signals POUT<0:3> or deactivate all the signals, according to the comparison result. The third controller 870 may activate a weak signal WEAK when one or more signals among the plurality of input signals PIN<0:3> and the plurality of output signals POUT<0:3> are enabled.

The first to third regions 810 to 830 and the first to third controllers 850 to 870 may be operated in a similar manner to the first to third regions 310 to 330 and the first to third controllers 340 to 360 in FIG. 3, respectively.

In addition to the above-described operation, the first controller 850 may store the row address ROWADD at a period in which an active operation and a write or read operation are performed. The first controller 850 may output the stored row address as SROWADD to the fourth region 840.

The fourth region 840 may store the repair information of weak cells. The fourth region 840 may include first to fourth repair address storage units 840_0 to 840_3. The repair address storage units 840_0 to 840_3 may store repair row addresses, and output the stored repair row addresses RRADD0 to RRADD3, the repair row addresses indicating the row addresses of the weak cells to be repaired with redundancy cells. The first to fourth repair address storage units 840_0 to 840_3 may generate a plurality of enable signals E0 to E3. When a repair row address is stored in each of the first to fourth repair address storage units 840_0 to 840_3, the repair address storage unit 840 may activate the corresponding enable signal among the plurality of enable signals E0 to E3. Each of the first to fourth repair address storage units 840_0 to 840_3 may store the address outputted from the first controller 850, when the corresponding storage signal among a plurality of storage signals ST0 to ST3 is activated.

When a fail signal FAIL is activated, the fourth controller 880 may control one of the first to fourth repair address storage units 840_0 to 840_3 to store the row address SROWADD outputted from the first controller 850. When the fail signal FAIL is activated, the fourth controller 880 may activate one of the plurality of storage signals ST0 to ST3. The fourth controller 880 may activate the storage signal corresponding to one repair address storage unit among the repair address storage units 840_0 to 840_3, the repair address storage unit corresponding to a deactivated enable signal. For example, when the enable signals E0 and E1 are activated and the enable signals E2 and E3 are deactivated, the fourth controller 880 may activate one of the storage signals ST2 and ST3 for the third and fourth repair address storage units 840_2 to 840_3.

The first to third controllers 850 to 870 of FIG. 8 may be disabled in response to the hit signal HIT, unlike the first to third controllers 340 to 360 of FIG. 3. That is, when the hit signal HIT is deactivated, the first to third controllers 850 to 870 of FIG. 8 may be operated in a similar manner to the first to third controllers 340 to 360 of FIG. 3, respectively. However, when the hit signal HIT is activated, the first to third controllers 850 to 870 may be disabled to not perform the operation described with reference to FIGS. 3 and 8, but deactivate all output signals COLCOMP, PIN<0:3>, POUT<0:3> and WEAK.

Referring again to FIG. 7, the ECC circuit 730 may perform an error detection and correction operation as described with reference to FIG. 2 However, when the error detection or correction operation fails, for example, when the ECC circuit 730 does not generate error-corrected data through ECC decoding, the ECC circuit 730 may activate the fail signal FAIL to indicate the fail. That is, the ECC circuit 730 may activate the fail signal FAIL when not detecting and correcting a data error of a weak cell. Thus, when the fail signal FAIL is activated, may indicate that the corresponding data including data of the weak cell cannot be corrected through the ECC circuit 730. This phenomenon may occur when an excessive number of error bits are contained in the data including the data of the weak cell.

The path selection unit 740, the refresh control unit 750 and the refresh counter 760 in FIG. 7 may be configured and operated in the same manner as the path selection unit 240, the refresh control unit 250 and the refresh counter 260 in FIG. 2, respectively.

The repair control unit 770 may receive repair row address RRADD0 to RRADD3, compare the received repair row address RRADD0 to RRADD3 with the row address ROWADD or refresh address REFADD, and generate the hit signal HIT and the plurality of redundancy select signals HIT0 to HIT3.

When the refresh signal REFS is deactivated, the repair control unit 770 may compare the row address ROWADD and the repair row addresses RRADD0 to RRADD3. The repair control unit 770 may activate the redundancy select signal HIT0 when the row address ROWADD is identical to the repair row address RRADD0. The repair control unit 770 may activate the redundancy select signal HIT1 when the row address ROWADD is identical to the repair row address RRADD1. The repair control unit 770 may activate the redundancy select signal HIT2 when the row address ROWADD is identical to the repair row address RRADD2. The repair control unit 770 may activate the redundancy select signal HIT3 when the row address ROWADD is identical to the repair row address RRADD3. Furthermore, when the row address ROWADD is identical to one or more repair row addresses among the repair row addresses RRADD0 to RRADD3, the repair control unit 770 may activate the hit signal HIT. Otherwise the repair control unit 770 may deactivate the hit signal HIT and the redundancy select signal HIT0 to HIT3.

When the refresh signal REFS is activated, the repair control unit 770 may compare the refresh address REFADD and the repair row addresses RRADD0 to RRADD3. The repair control unit 770 may activate the redundancy select signal HIT0 when the refresh address REFADD is identical to the repair row address RRADD0. The repair control unit 770 may activate the redundancy select signal HIT1 when the refresh address REFADD is identical to the repair row address RRADD1. The repair control unit 770 may activate the redundancy select signal HIT2 when the refresh address REFADD is identical to the repair row address RRADD2. The repair control unit 770 may activate the redundancy select signal HIT3 when the refresh address REFADD is identical to the repair row address RRADD3. Furthermore, when the refresh address REFADD is identical to one or more repair row addresses among the repair row addresses RRADD0 to RRADD3, the repair control unit 770 may activate the hit signal HIT. Otherwise, the repair control unit 770 may deactivate the hit signal HIT and the redundancy select signal HIT0 to HIT3.

The memory device of FIG. 7 may manage weak cells its using the ECC circuit 730, and replace weak cells which cannot be managed through the ECC circuit 730, with redundancy cells. Thus, the memory device can increase the refresh cycle as much as possible, thereby effectively managing the weak cells while reducing the current or power consumption caused by the refresh operation. For reference, when a weak cell is replaced with a repair cell, it may indicate that a redundancy cell is used instead of the weak cell when a row and column address corresponding to the weak cell is inputted. That is, when data are written to the weak cell, the data may be written to the redundancy cell replacing the weak cell, and when data of the weak cell are read, data of the redundancy cell replacing the weak cell may be read.

Figure 9:
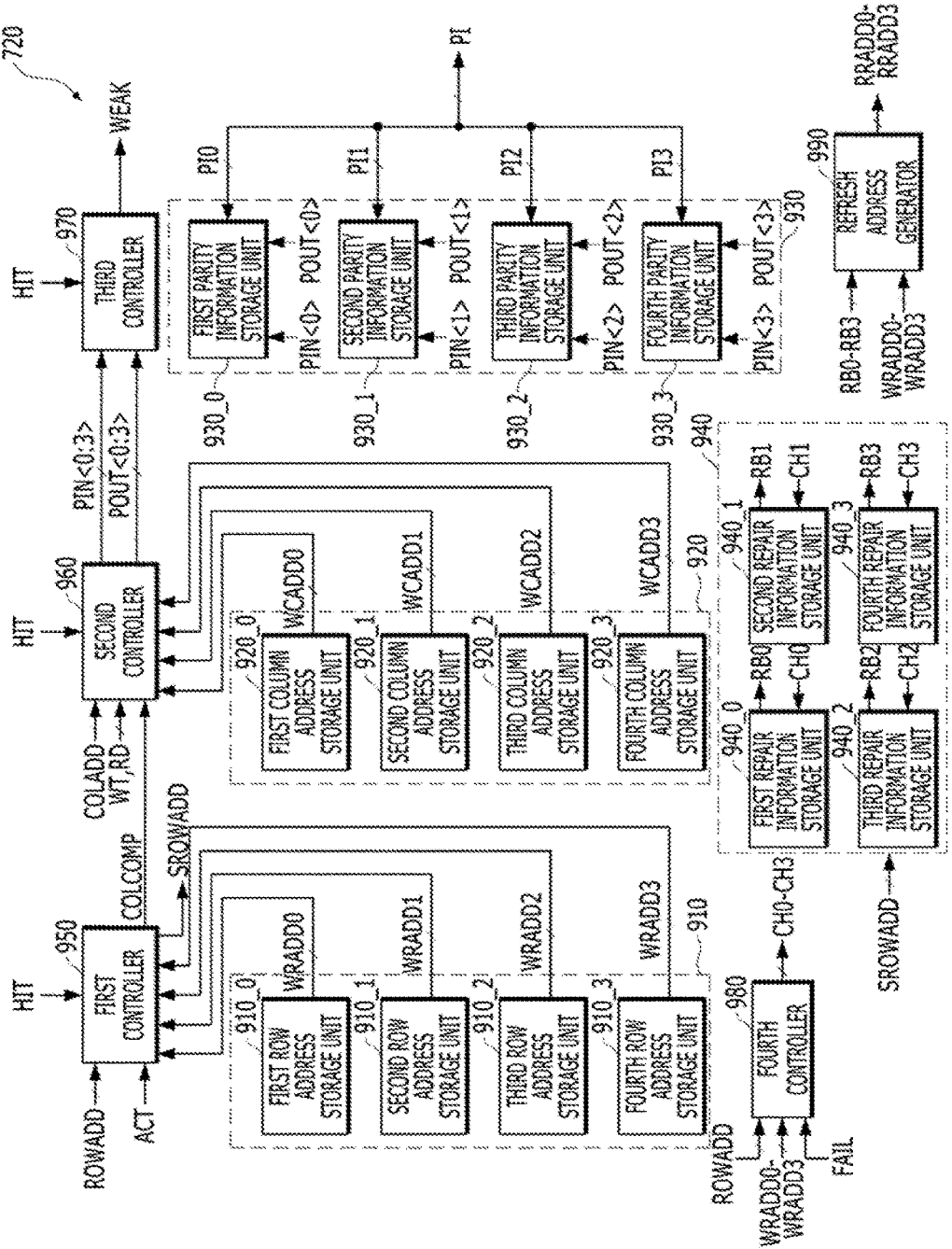
FIG. 9 is a diagram of a weak cell information storage unit in accordance with a second example.

FIG. 9 is a diagram of the weak cell information storage unit 720 in accordance with a second example.

Referring to FIG. 9, the weak cell information storage unit 720 may include first to fourth regions 910 to 940, first to fourth controllers 950 to 980 and a repair address generator 990.

The first to third regions 910 to 930 and the first to third controllers 950 to 970 may be operated in a similar manner to the first to third regions 810 to 830 and the first to third controllers 850 to 870 in FIG. 8, respectively.

The fourth region 940 may store the repair information of weak cells. The fourth region 940 may include first to fourth repair information storage units 940_0 to 940_3. The repair information storage units 940_0 to 940_3 may store one-bit information on whether a repair operation was performed, and output the stored repair information as RB0 to RB3. Hereafter, the one-bit information will be referred to as repair one-bit information. For reference, when the logic value of the repair one-bit information is a first logic value for example, 0, it may indicate that a weak cell was not replaced with a redundancy cell, and when the logic values of the repair one-bit information is second logic value for example, 1, it may indicate that a weak cell was replaced with a redundancy cell. The initial values stored in the respective repair information storage units 940_0 to 940_3 may be set to the first logic value indicating that a weak cell was not replaced with a redundancy cell. The value stored in each of the first to fourth repair information storage units 940_0 to 940_3 may be changed to the second logic value from the first logic value, when a corresponding change signal among a plurality of change signals CH0 to CH3 is activated.

The fourth controller 980 may store the row address ROWADD at a period in which an active operation and a write operation or read operation are performed. When the fail signal FAIL is activated, the fourth controller 980 may compare the weak row addresses WRADD0 to WRADD3 outputted from the first to fourth row addresses 910_0 to 910_3 with the row address ROWADD stored therein, and activate one change signal among the plurality of change signals CH0 to CH3. When the fail signal FAIL is activated, the fourth controller 980 may activate the change signal CH0 when the row address ROWADD stored therein is identical to the weak row address WRADD0. When the fail signal FAIL is activated, the fourth controller 980 may activate the change signal CH1 when the row address ROWADD stored therein is identical to the weak row address WRADD1. When the fail, signal FAIL is activated, the fourth controller 980 may activate the change signal CH2 when the address ROWADD stored therein is identical to the weak row address WRADD2. When the fail signal FAIL is activated, the fourth controller 980 may activate the change signal CH3 when the row address ROWADD stored therein is identical to the weak row address WRADD3.

The repair address generator 990 may generate the first to fourth repair row addresses RRADD0 to RRADD3 in response to the first to fourth weak row addresses WRADD0 to WRADD3 and the respective pieces of repair one-bit information RB0 to RB3. The repair address generator 990 may not transmit the first weak row address WRADD0 as the first repair row address RRADD0 when the repair one-bit information RB0 has the first logic value, and transmit the first weak row address WRADD0 as the first repair row address RRADD0 when the repair one-bit information RB0 has the second logic value. The repair address generator 990 may not transmit the second weak row address WRADD1 as the second repair row address RRADD1 when the repair one-bit information RB1 has the first logic value, and transmit the second weak row address WRADD1 as the second repair row address RRADD1 when the repair one-bit information RB1 has the second logic value. The repair address generator 990 may not transmit the third weak row address WRADD2 as the third repair row address RRADD2 when the repair one-bit information RB2 has the first logic value, and transmit the third weak row address WRADD2 as the third repair row address RRADD2 when the repair one-bit information RB2 has the second logic value. The repair address generator 990 may not transmit the fourth weak row address WRADD3 as the fourth repair row address RRADD3 when the repair one-bit information RB3 has the first logic value, and transmit the fourth weak row address WRADD3 as the fourth repair row address RRADD3 when the repair one-bit information RB3 has the second logic value.

Figure 10:
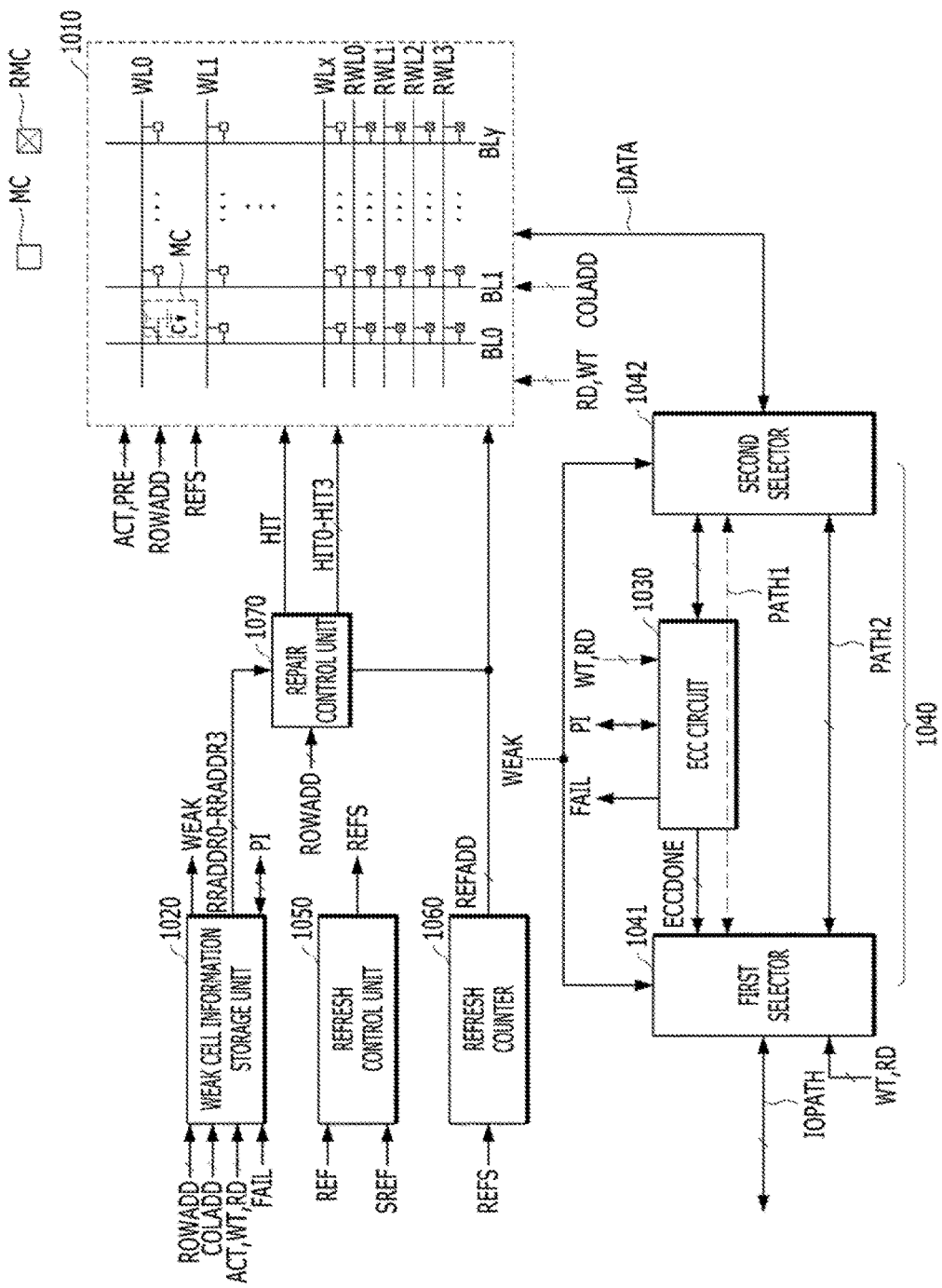
FIG. 10 is a diagram of a memory device in accordance with an embodiment.

FIG. 10 is a diagram of a memory device in accordance with still yet another embodiment.

Referring to FIG. 10, the memory device may include a cell array 1010, a weak cell information storage unit 1020, an error correction code (ECC) circuit 1030, a path selection unit 1040, a refresh control unit 1050, a refresh counter 1060 and a repair control unit 1070.

The cell array 1010, the refresh control unit 1050, the refresh counter 1060 and the repair control unit 1070 which are included in the memory device of FIG. 10 may be configured and operated in the same manner as those of the memory device of 7, and the weak cell information storage unit 1020 may be configured and operated in the same manner as the weak cell information storage unit 720 shown in 8 or the weak cell information storage unit 720 shown in FIG. 9.

The ECC circuit 1030 may perform an error detection and correction operation as described with reference to FIG. 5. However, when the error detection or correction operation fails, the ECC circuit 1030 may activate a fail signal FAIL to indicate the fail. The path selection unit 1040 may be configured and operated in the same manner as the path selection unit 540 of the memory device of FIG. 5.

A part for storing various addresses or various pieces of information in the weak cell information storage unit may include a volatile memory or nonvolatile memory. The part for storing various addresses or various pieces of information in the weak cell information storage unit may include a volatile memory such as dynamic random access memory (DRAM), static RAM (SRAM), thyristor RAM (T-RAM), zero capacitor RAM (Z-RAM) or twin transistor RAM (TTRAM) or one of various memories for storing data by performing a similar function to the volatile memory. Furthermore, the part for storing various addresses or various pieces of information in the weak cell information storage unit may include a fuse circuit, a nonvolatile memory such as read only memory (ROM), NOR flash memory, NAND flash memory, phase change random access memory (PRAM), resistive RAM (RRAM), spin transfer torque RAM (STTRAM), magnetic RAM (MRAM) or one of various memories for storing data by performing a similar function to the nonvolatile memory.

In accordance with the present embodiments, the memory device can correct data errors of weak cells using the ECC circuit, thereby effectively managing the weak cells while increasing the refresh cycle applied to the entire memory cells.

Although various embodiments have been described for illustrative purposes, it will be apparent to those skilled in the art that various changes and modifications may be made without departing from the spirit and scope of the invention as defined in the following claims.

What is claimed is:

1. A memory device comprising:
    a plurality of memory cells;
    a weak cell information storage unit suitable for storing a weak address and parity information corresponding to at least one weak cell having a shorter data retention time than a reference time, among the plurality of memory cells, and generating a weak signal based on the weak address and inputted addresses;
    an error correction code (ECC) circuit suitable for generating the parity information of the at least one weak cell to store in the weak cell information storage unit, and correcting an error bit of the at least one weak cell using the parity information stored in the weak cell information storage unit, among the plurality of memory cells, in response to the weak signal; and
    a refresh control unit suitable for controlling the plurality of memory cells to be refreshed at a cycle equal to or more than the reference time.

2. The memory device of claim 1, wherein the ECC circuit generates the parity information by ECC encoding write data corresponding to the at least one weak cell, among the plurality of memory cells, in response to the weak signal, during a write operation.

3. The memory device of claim 1, wherein the ECC circuit generates error-corrected data by ECC decoding read data outputted from the at least one weak cell and the parity information in response to the weak signal, during a read operation.

4. The memory device of claim 1, wherein when reading data of memory cells other than the at least one weak cell among the plurality of memory cells, the memory device outputs the data without delaying the data.

5. The memory device of claim 4, further comprising:
    a first data path that passes through the ECC circuit during a read or write operation;
    a second data path that bypass the ECC circuit during a read or write operation; and
    a path selection unit suitable for selecting the first data path to transfer data inputted to or outputted from the at least one weak cell, and selecting the second data path to transfer data inputted to or outputted from the memory cells other than the at least one weak cell.

6. The memory device of claim 1, wherein when reading data of memory cells other than the at least one weak cell, the memory device delays the data of the memory cells other than the at least one weak cell by an operation time of the ECC circuit.

7. The memory device of claim 6, further comprising:
    a first data path that passes through the ECC circuit during a read or write operation;
    a second data path that bypass the ECC circuit during a read or write operation; and
    a path selection unit suitable for selecting the first data path to transfer data inputted to or outputted from the at least one weak cell, selecting the second data path to transfer data inputted to or outputted from the memory cells other than the at least one weak cell, and delaying the data inputted to or outputted from the memory cells other than the at least one weak cell by the operation time of the ECC circuit.

8. The memory device of claim 1, wherein the weak cell information storage unit comprises:
    a first region suitable for storing a row address of the at least one weak cell;
    a second region suitable for storing a column address of the at least one weak cell; and
    a third region suitable for storing the parity information of the at least one weak cell.

9. A memory device comprising:
    a plurality of memory cells;
    at least one redundancy cell;
    a weak cell information storage unit suitable for storing a weak address and parity information corresponding to at least one weak cell having a shorter data retention time than a reference time, among the plurality of memory cells, and repair information corresponding to all or part of the at least one weak cell, and generating a weak signal based on the weak address and inputted addresses;
    an error correction code (ECC) circuit suitable for generating the parity information of the at least one weak cell to store in the weak cell information storage unit, and correcting an error bit of the at least one weak cell using the parity information stored in the weak cell information storage unit, among the plurality of memory cell, in response to the weak signal;
    a refresh control unit suitable for controlling the plurality of memory cells to be refreshed at a cycle equal to or more than the reference time; and
    a repair control unit suitable for replacing a weak cell corresponding to the repair information among the at least one weak cell with the at least one redundancy cell, in response to the repair information.

10. The memory device of claim 9, wherein the weak cell information storage unit stores repair information of a weak cell having an error bit which cannot be corrected by the ECC circuit, among the at least one weak cell.

11. The memory device of claim 9, wherein the repair information of the at least one weak cell comprises an address of the at least one weak cell.

12. The memory device of claim 9, wherein the repair information of the at least one weak cell comprises one bit indicating whether the at least one weak cell is repaired.

13. The memory device of claim 9, wherein the ECC circuit generates the parity information by ECC encoding write data corresponding to the at least one weak cell, among the plurality of memory cell, in response to the weak signal, during a write operation.

14. The memory device of claim 9, wherein the ECC circuit generates error-corrected data by ECC decoding the parity information and read data outputted from the at least one weak cell in response to the weak signal, during a read operation.

15. The memory device of claim 9, wherein when reading data of memory cells other than the at least one weak cell among the plurality of memory cells, the memory device outputs the data without delaying the data.

16. The memory device of claim 9, wherein when reading data of memory cells other than the at least one weak cell, the memory device delays the data of the memory cells other than the at least one weak cell by an operation time of the ECC circuit.

17. The memory device of claim 9, wherein the weak cell information storage unit comprises:

a first region suitable for storing a row address of the at least one weak cell;

a second region suitable for storing a column address of the at least one weak cell;

a third region suitable for storing the parity information of the at least one weak cell; and a fourth region suitable for storing the repair information of the at least one weak cell.

\* \* \* \* \*